US005322807A

United States Patent [19]
Chen et al.

[11] Patent Number: 5,322,807
[45] Date of Patent: Jun. 21, 1994

[54] METHOD OF MAKING THIN FILM TRANSISTORS INCLUDING RECRYSTALLIZATION AND HIGH PRESSURE OXIDATION

[75] Inventors: Min-Liang Chen, Hsin, Taiwan; Pradip K. Roy, Allentown, Pa.

[73] Assignee: AT&T Bell Laboratories, Murray Hill, N.J.

[21] Appl. No.: 932,445

[22] Filed: Aug. 19, 1992

[51] Int. Cl.$^5$ .................. H01L 21/265; H01L 21/335
[52] U.S. Cl. ........................ 437/40; 437/41; 437/101; 437/239
[58] Field of Search .......... 437/21, 40, 41, 101, 437/909, 239

[56] References Cited

U.S. PATENT DOCUMENTS

| | | |
|---|---|---|
| 3,974,515 | 8/1976 | Ipri et al. |
| 4,675,978 | 6/1987 | Swartz .................... 437/21 |
| 5,112,764 | 5/1992 | Mitra et al. ............ 437/40 |
| 5,198,379 | 3/1993 | Adar ........................ 437/21 |

FOREIGN PATENT DOCUMENTS 2-103925  4/1990  Japan ........................... 437/21

OTHER PUBLICATIONS

1989 IEEE Transactions on Electron Devices, vol. 36, No. 2, "High Performance Low-Temperature Poly-Si n-Channel TFT's for LCD," by Akio Mimura, et al., Feb. 1989, pp. 351-359.
Japanese Journal of Applied Physics, vol. 30, No. 18, "Leakage Current Reduction of Poly-Si Thin Film Transistors by Two-Step Annealing," by Takashi Aoyama, et al., Jan. 1991, pp. L84-L87.
IEEE Transactions on Electron Devices, vol. ED-33, No. 4, "Polycrystalline-Silicon Device Technology for Large-Area Electronics", by William G. Hawkins, Apr. 1986, pp. 477-481.

Primary Examiner—Mary Wilczewski
Attorney, Agent, or Firm—Richard D. Laumann

[57] ABSTRACT

A thin film transistor is formed by depositing amorphous silicon and forming a gate structure and then using a high-pressure oxidation to form a high-quality gate oxide that has a layered structure.

8 Claims, 1 Drawing Sheet

METHOD OF MAKING THIN FILM TRANSISTORS INCLUDING RECRYSTALLIZATION AND HIGH PRESSURE OXIDATION

TECHNICAL FIELD

This invention relates to a method of making thin film transistors by depositing layered amorphous silicon and then heat treating the amorphous silicon.

BACKGROUND OF THE INVENTION

Field effect transistors are ubiquitous in modern electronics technology. This type of transistor has been primarily fabricated in single crystal silicon, i.e., in a single crystal wafer or in an epitaxial layer grown on a single crystal wafer. The high quality single crystal silicon has good properties for transistors in terms of, e.g., carrier transport and interface characteristics.

There are, however, applications where use of single crystal silicon is difficult or impossible. For example, field effect transistors are used in making active matrix liquid crystal displays. These transistors are fabricated on glass substrates. Additionally, static random access memories (SRAMs) can be fabricated in cells which have six transistors. Two transistors function as electrical loads and the cell size is reduced when the load transistors are fabricated above the other four transistors rather than in the same plane. In this case, the load transistors are fabricated in a material formed on a dielectric layer which separates the load transistors from the other four transistors. For use in these, as well as other, applications, thin film transistors (TFTs) have been developed. Such transistors are frequently fabricated using polysilicon, rather than single crystal silicon, as the channel material, i.e., the material in which the current flows.

TFTs for active loads in SRAM cells should satisfy several criteria, and the nature of the polysilicon determines how easily these criteria can be satisfied. One criterion of great interest is the ratio of the ON state current to the OFF state current. This ratio should be as large as is possible. The lower OFF state current indicates lower standby current, and the higher ON state current improves both performance and cell stability. Two primary factors influencing this ratio are the grain size of the silicon in the channel and the oxide/polysilicon interface, i.e., the interface between the oxide of the gate structure and the polysilicon of the channel. Larger grain size increases the carrier mobility as compared to smaller grain size and also increases the ON state current. Larger grains also result in less dopant diffusion from the source/drain regions into the channel. Such diffusion would result in a shorter effective channel and a greater OFF state current than would the longer channel. The larger grains also reduce the back channel leakage current and thereby reduce the OFF state current. The oxide/polysilicon interface is important because a poor quality interface may have many dangling bonds which result in charge trapping. More importantly, a poor interface enhances the surface scattering of carriers and thus decreases the effective carrier mobility. Similar considerations are applicable to the TFTs used for display purposes.

The quality of the polysilicon is thus important for device purposes and much attention has been directed toward forming polysilicon with the desired characteristics. For example, Mimura, *IEEE Transactions on Electron Devices*, 36, February 1989, pp. 351-359, describes the deposition of silicon by low-pressure chemical vapor deposition at temperatures between 500° C. and 550° C. followed by a 600° C. anneal for 24 hours in nitrogen to recrystallize the silicon. The transition temperature between amorphous and poly structure is around 545° C. To ensure a real amorphous structure, one has to deposit the Si at a temperature well below the transition temperature. To get the large grain polysilicon, one has to regrow the amorphous Si at a low regrowth rate, which means slightly higher than the transition temperature for a longer time to avoid secondary recrystallization. In the *Japanese Journal of Applied Physics*, 30, January 1991, pp. 184-187, Aoyama describes a two-step annealing process which reduces the leakage current. Amorphous silicon was deposited at 550° C. and annealed for ten hours in a nitrogen atmosphere at 600° C. to recrystallize the silicon. See also, *IEEE Transactions on Electron Devices*, ED-33, April 1986, pp. 477-481 for a discussion of thin film transistors.

Not only is the oxide/polysilicon interface important, the quality of the oxide is also important. Deposited oxides typically have poor dielectric quality and are sensitive to both the polysilicon structure and dopant concentration. Grown oxides are difficult to fabricate because of the limited thermal budget after the transistors' source-drain formation. Additionally, the surface morphology of the polysilicon, together with the limited thermal budget, makes conventional oxidation impractical.

SUMMARY OF THE INVENTION

A method of manufacturing a thin film transistor comprising the steps of depositing silicon over an insulating substrate; forming a gate structure contacting at least a portion of the silicon, the gate structure having an oxide layer contacting the silicon and a conducting region separated from the silicon by the oxide; annealing to recrystallize the silicon; and forming an additional oxide between the gate structure and the silicon by high pressure oxidation. In a preferred embodiment, the silicon is deposited as amorphous silicon by using a deposition temperature below the recrystallization temperature. This temperature is approximately 575° C. and is the amorphous to crystalline transition temperature. The deposition temperature is desirably less than this temperature. In another preferred embodiment, the deposited silicon comprises a plurality of layers. In yet another preferred embodiment, the annealing is at a temperature less than 600° C. The insulating substrate may be a glass substrate or it may be a dielectric layer formed in integrated circuit manufacturing. The gate structure may be either above or below the silicon; that is, it may be formed either before or after the silicon is deposited. Thin film transistors according to this invention have a silicon layer on an insulating substrate. The silicon layer has source and drain regions, and there is a gate structure contacting the silicon layer between the source and drain regions. The gate structure has a layered oxide contacting the silicon.

BRIEF DESCRIPTION OF THE DRAWING

For reasons of clarity, the elements depicted are not drawn to scale. Identical numerals in different figures represent identical elements.

DETAILED DESCRIPTION

The invention will be described by references to particular embodiments. Variations will be apparent to those skilled in the art.

Figure 1:
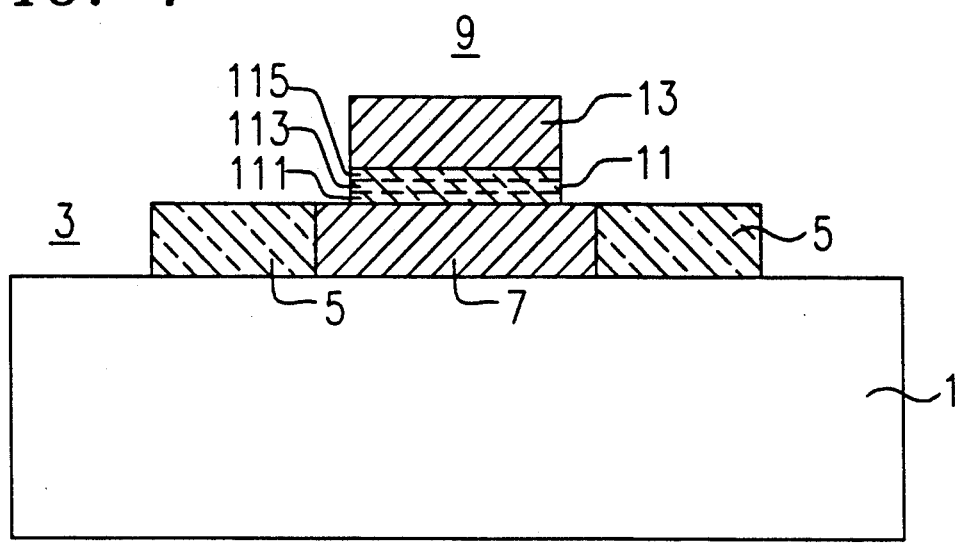
FIGS. 1 and 2 are sectional views of a thin-film transistor fabricated according to this invention.

FIG. 1 is a sectional view of a thin film transistor fabricated according to an embodiment of this invention and depicts substrate 1, silicon region 3 having source/drain regions 5 and channel region 7, gate structure 9 having oxide region 11 and conducting region 13 separated from the silicon 3. Region 3 is over the substrate. Oxide region 11 is between the channel region 7 and conducting region 13. The term substrate is used to mean a material that lies underneath and supports another material. The substrate may be a glass layer or it may be a dielectric layer such as one formed in semiconductor integrated circuits.

Formation of the transistor will be described. The substrate will be readily formed by those skilled in the art. If it is a dielectric layer, such as one used in integrated circuits embodying, for example, SRAM cells, the devices and contacts to the devices underneath the dielectric layer will be readily formed by those skilled in the art. Silicon region 3 is desirably formed by depositing the silicon at a temperature less than the recrystallization temperature which is approximately 575° C. The silicon is deposited as amorphous silicon, and it is found that amorphous silicon leads to larger grains after a recrystallizing anneal than does polysilicon. Formation of large grains is also facilitated by using deposition conditions such that region 3 has a layered structure. An appropriate layered structure may be obtained by varying deposition parameters such as the deposition rate. Deposition is accomplished by, for example, low-pressure chemical vapor deposition (LPCVD) which involves the decomposition of a silicon-containing precursor gas. Such deposition techniques and appropriate precursor gases are well known in the art and will be readily selected. The recrystallization anneal may be performed now, i.e., after deposition. A temperature less than 625° C. is desirably used. Temperatures above 650° C. are undesirable because of secondary recrystallization which leads to large variability in the grain structure. Such variability may produce localized abnormal grain growth. The gate structure which has a conducting region 13, typically polysilicon, separated from the silicon 3 by the oxide 11 will be readily formed by those skilled in the art, as will the source/drain region 5. A channel implant may be performed before the gate structure is formed to adjust the proper channel threshold voltage of the TFT.

The oxide layer 11 is really a composite structure having regions 111, 113, 115. It is formed from a thin, less than 100 Å, grown layer 113, an optional deposited layer 115 such as a TEOS SiO$_2$ layer (100 Å to 150 Å thick) that is densified by high-pressure oxidation (HiPOX) to attain a total stacked oxide thickness of 250 Å to 300 Å. The oxide layer 11 has been patterned as part of the gate structure fabrication. Oxide may be left on all of the silicon, if desired. The grown layer is very thin and does not expend much of the thermal budget. It can be grown thermally at a temperature less than 825° C. or by HiPOX. The deposited layer is a conformal layer and will be readily formed by those skilled in the art. High pressure oxidation is well known to those skilled in the art and need not be described in detail. A pressure in the range of 5 to 10 atmospheres with a temperature between 800° C. and 825° C. has been found to give good results. For the growth of a TFT dielectric, there are two opposing conditions that have to be fulfilled: (i) a high-quality dielectric (higher breakdown strength and charge to breakdown, lower defect and interface trap densities and a relatively stress-free Si/SiO$_2$ interface); and, (ii) due to a limited thermal budget, the oxide has to be grown at a temperature less than 825° C.

These conditions are fulfilled by using a stacked HiPOX oxidation scheme. This scheme involves the growth of a first layer 113 50 Å to 100 Å thick by either conventional or high-pressure oxidation at a temperature less than 825° C. onto which a 100 Å to 150 Å thick layer 115 of SiO$_2$ can be deposited by low-pressure (approximately 0.25 torr) decomposition of TEOS at 650° C. to form the second layer. A third layer 111 is grown underneath the first layer by an oxidizing HiPOX anneal at a pressure between 1 and 10 atmospheres and a temperature less than 825° C. The purpose of a second TEOS-SiO$_2$ layer 115 is to tailor both the thermal and thickness budgets. The HiPOX densification, i.e., the oxidizing HiPOX anneal, generates a better quality dielectric with superior Si/SiO$_2$ interfacial characteristics than did the previously described processes. It will be apparent that the oxide is a layered oxide as depicted. It will be appreciated that the layers differ primarily in structure as they have nominally identical compositions. Although it has a nominally uniform composition, the different formation processes used for the oxides result in structural differences and a layered structure. The thin film transistor may be used as the load in SRAM cells or it may be used in active matrix liquid crystal displays. Other uses will be apparent to those skilled in the art.

Figure 2:
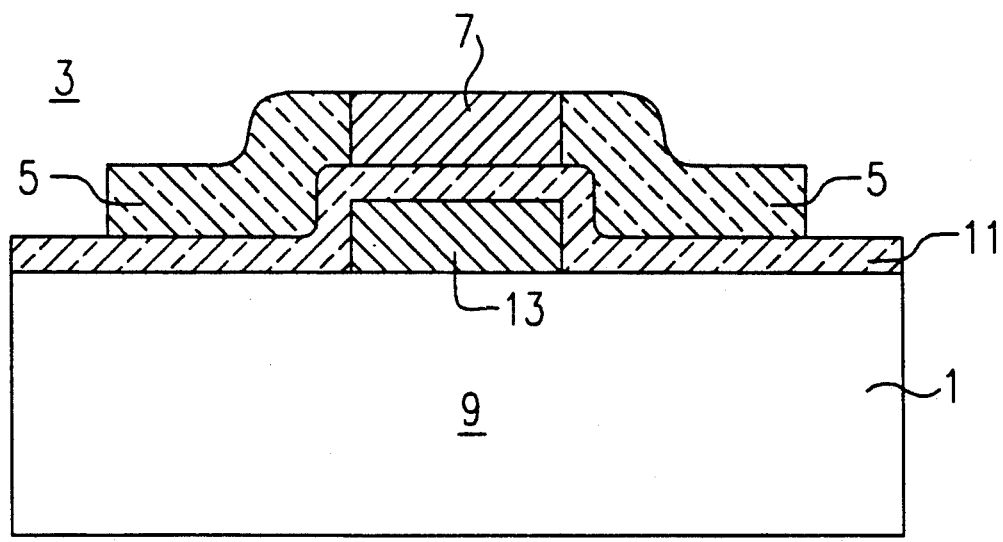

Another thin film transistor fabricated according to a method of this invention is depicted in FIG. 2. This transistor is generally similar to that depicted in FIG. 1 and is formed by a method similar to that described with respect to FIG. 1, although it will be appreciated that the order of silicon deposition and gate structure formation has been reversed. For reasons of clarity, the elements of the gate oxide are not depicted. This embodiment is somewhat less desirable than that depicted in FIG. 1. The HiPOX improves the oxide quality at the polysilicon surface in FIG. 1 and at the gate bottom in FIG. 2. The former leads to fewer trapped charges and hence a higher ON/OFF ratio. In the embodiments depicted in FIGS. 1 and 2, the HiPOX-stacked oxidation approach results in reduced leakage paths (lower Do) and breakdown and charge fluence characteristics of the TFT. This, in turn, allows a further scaling down of the TFT gate dielectric thickness to gain a higher ON state current.

Still other variations will be thought of by those skilled in the art.

We claim:

1. A method of manufacturing a thin film transistor comprising the steps of:
   depositing silicon over an insulating substrate;
   forming a gate structure contacting at least a portion of said silicon, said gate structure having an oxide layer contacting said silicon and a conducting region separated from said silicon by said oxide;
   annealing to recrystallize said silicon; and forming an additional oxide between said gate structure and said silicon by high pressure oxidation.

2. A method as recited in claim 1 in which said silicon comprises a plurality of layers.

3. A method as recited in claim 2 in which said depositing is at a temperature less than the recrystallization temperature and amorphous silicon is deposited.

4. A method as recited in claim 1 in which said substrate comprises a glass.

5. A method as recited in claim 1 in which said substrate comprises a dielectric layer formed in integrated circuit fabrication.

6. A method as recited in claim 1 in which said gate structure is formed before said silicon is deposited.

7. A method as recited in claim 1 in which silicon is deposited before said gate structure is formed.

8. A method as recited in claim 1 in which said annealing is at a temperature less than 620° C.

* * * * *